United States Patent
Lopez et al.

(10) Patent No.: US 9,553,068 B2
(45) Date of Patent: *Jan. 24, 2017

(54) INTEGRATED CIRCUIT ("IC") ASSEMBLY INCLUDES AN IC DIE WITH A TOP METALLIZATION LAYER AND A CONDUCTIVE EPOXY LAYER APPLIED TO THE TOP METALLIZATION LAYER

(71) Applicant: Texas Instruments Incorporated, Dallas, TX (US)

(72) Inventors: Osvaldo Jorge Lopez, Annandale, NJ (US); Jonathan Almeria Noquil, Bethlehem, PA (US); Juan Herbsommer, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/725,377

(22) Filed: May 29, 2015

(65) Prior Publication Data

US 2015/0262965 A1 Sep. 17, 2015

Related U.S. Application Data

(63) Continuation of application No. 13/754,513, filed on Jan. 30, 2013, now Pat. No. 9,076,891.

(51) Int. Cl.
*H01L 23/495* (2006.01)
*H01L 23/00* (2006.01)
(Continued)

(52) U.S. Cl.
CPC ............. *H01L 24/49* (2013.01); *H01L 23/28* (2013.01); *H01L 23/49562* (2013.01); *H01L 23/49811* (2013.01); *H01L 23/49838* (2013.01); *H01L 23/49861* (2013.01); *H01L 23/49883* (2013.01); *H01L 24/06* (2013.01); *H01L 24/29* (2013.01); *H01L 24/83* (2013.01); *H01L 24/85* (2013.01); *H01L 24/45* (2013.01); *H01L 2224/04042* (2013.01); *H01L 2224/05078* (2013.01); *H01L 2224/05573* (2013.01); *H01L 2224/29026* (2013.01); *H01L 2224/29139* (2013.01); *H01L 2224/45015* (2013.01); *H01L 2224/45124* (2013.01); *H01L 2224/45144* (2013.01); *H01L 2224/45147* (2013.01); *H01L 2224/48091* (2013.01); *H01L 2224/48247* (2013.01); *H01L 2224/48464* (2013.01); *H01L 2224/4912* (2013.01); *H01L 2224/49111* (2013.01); *H01L 2224/73265* (2013.01);
(Continued)

(58) Field of Classification Search
CPC .. H01L 23/4952; H01L 24/85; H01L 29/0665; H01L 2224/83856; H01L 2224/48227
See application file for complete search history.

(56) References Cited

U.S. PATENT DOCUMENTS 9,076,891 B2 7/2015 Lopez et al.
2002/0195268 A1 12/2002 Schendel
(Continued)

*Primary Examiner* — Thanh V Pham
(74) *Attorney, Agent, or Firm* — Tuenlap Daniel Chan; Frank D. Cimino

(57) ABSTRACT

An integrated circuit ("IC") assembly includes an IC die with a metallization layer on a top surface thereof. A plurality of lead wires are bonded at first end portions thereof to the metallization layer. A conductive layer is attached to the metallization layer and covers the first ends of the lead wires.

17 Claims, 4 Drawing Sheets

(51) Int. Cl.
*H01L 23/28* (2006.01)
*H01L 23/498* (2006.01)

(52) U.S. Cl.
CPC .............. *H01L 2224/83851* (2013.01); *H01L 2224/8592* (2013.01); *H01L 2224/85205* (2013.01); *H01L 2924/01047* (2013.01); *H01L 2924/0665* (2013.01); *H01L 2924/07811* (2013.01); *H01L 2924/15747* (2013.01); *H01L 2924/181* (2013.01)

(56) References Cited

U.S. PATENT DOCUMENTS

2007/0228534 A1  10/2007  Uno et al.
2014/0210064 A1  7/2014  Lopez et al.

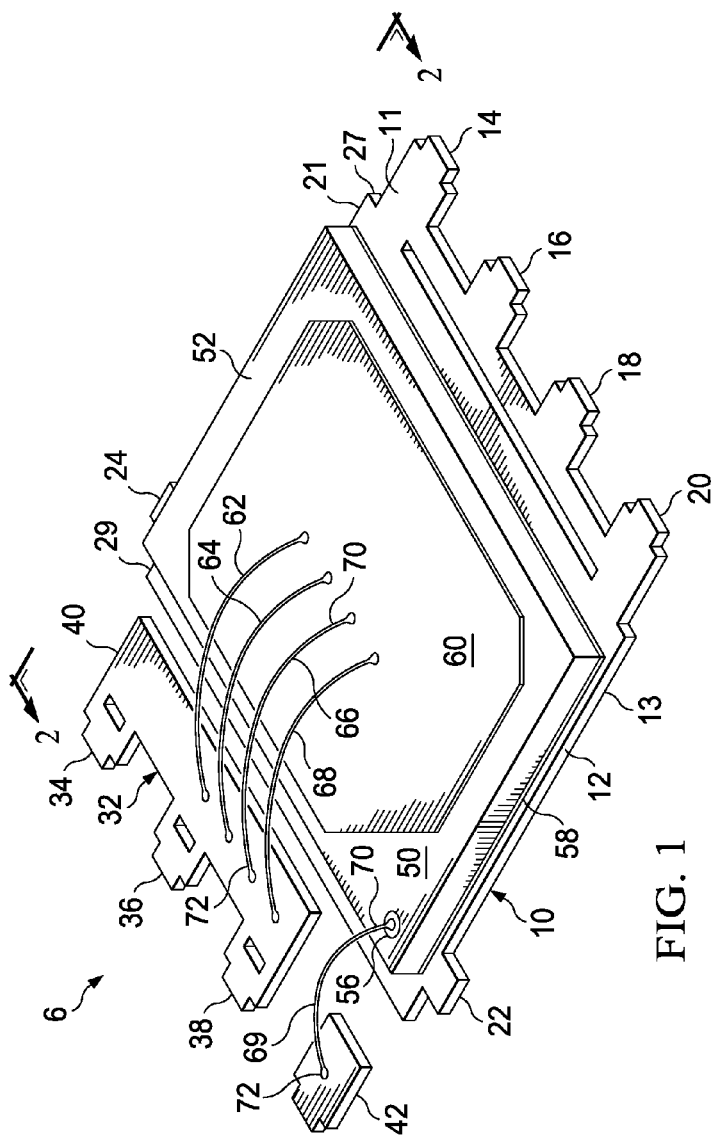

INTEGRATED CIRCUIT ("IC") ASSEMBLY INCLUDES AN IC DIE WITH A TOP METALLIZATION LAYER AND A CONDUCTIVE EPOXY LAYER APPLIED TO THE TOP METALLIZATION LAYER

This application claims the benefit under 35 U.S.C.§120 of non-provisional application Ser. No. 13/754,513, filed Jan. 30, 2013, issued as U.S. Pat. No. 9,076,891 on Jul. 7, 2015, the entirety of which is incorporated herein by reference.

BACKGROUND

Semiconductor devices, to be useful, must be electrically connected to one another or to other electronic devices or to interconnect boards such as printed circuit boards and carrier boards. Leadframes made from conductive metal such as copper, silver or gold are often used to electrically connect the semiconductor device to other electronic devices. One popular and flexible method of connecting semiconductors devices to leadframes and/or other electronics is wire bonding. Bondwires usually consist of aluminum, copper or gold. Bond wire diameters typically range from about 15 μm to several hundred micrometers in high-power applications. There are two basic types of wire bonding—ball bonding and wedge bonding.

Ball bonding usually uses a combination of heat, pressure and ultrasonic energy. In ball bonding, a small molten ball is formed at the end of the bondwire by application of a high voltage charge through a tool holding and dispensing the wire known as a capillary. This ball is placed in contact with the electrical contact surface of a chip that is usually copper or aluminum. A combination of heat, pressure and ultrasonic energy is then applied which creates a weld between the ball and the metal surface that it contacts. The ball bond is sometimes referred to as the first bond because it is usually the first bond made in wire bonding of an IC chip/die to a leadframe.

In a die leadframe interconnection, the type of wire bond that is generally used to connect the second end of the bond wire to the leadframe is a called a wedge bond or sometimes second bond. It is formed by crushing the end of the bondwire between the leadframe or other metal surface and the tip of the capillary tool.

A leadframe often forms part of the electrical connection between a semiconductor device and other electronics. In some cases the die and bond wires connecting it to a leadframe are encapsulated within a hard protective shell that is typically formed by a molding operation. One or more surfaces of lead portions of the leadframe are not covered by the protective shell and may be electrically and mechanically connected to external circuits. The combination of an integrated circuit ("IC") die, leadframe, bond wires and encapsulating material is generally referred to as an integrated circuit package (IC package). There are various types of IC packages. The difference between IC packages is primarily determined by how the lead portions of the leadframe are exposed, the configuration and number of the exposed lead portions, how the package is mounted and the size or shape of the package. For example below is a list of so called "flat packages" that are commercially available:

Flatpack, early metal/ceramic case with flat leads
CFP: Ceramic Flat Pack
CQFP: ceramic quad flat-pack, similar to PQFP
BQFP: Bumpered Quad Flat Pack
DFN: Dual Flat Pack, No Lead
ETQFP: Exposed Thin Quad Flat Package
PQFN: power quad flat-pack, no-leads, with exposed die-pad[s] for heatsinking
PQFP: Plastic quad flat package
LQFP: Low-profile Quad Flat Package
QFN: Quad Flat No Leads, also called micro lead frame (MLF).
Quad Flat Package: (QFP)
MQFP—Metric Quad Flat Pack, a QFP with metric pin distribution
HVQFN: Heat-sink very-thin quad flat-pack no-leads
SIDEBRAZE
TQFP: Thin Quad Flat Pack
TQFN: Thin Quad Flat No-Lead
VQFB: Very-thin Quad Flat Pack Even though IC packages are available in an assortment of types and sizes, certain features thereof such as, for example, wire bond connections between an IC die and a leadframe, have remained essentially the same from package to package.

BRIEF DESCRIPTION OF THE DRAWINGS

FIG. 1 is a top isometric view of an integrated circuit assembly that is a subassembly of a power quad flat no-lead ("PQFN") package at one stage in the formation process.

FIG. 2 is a side elevation view of the integrated circuit assembly of FIG. 1.

DETAILED DESCRIPTION

Figure 3:
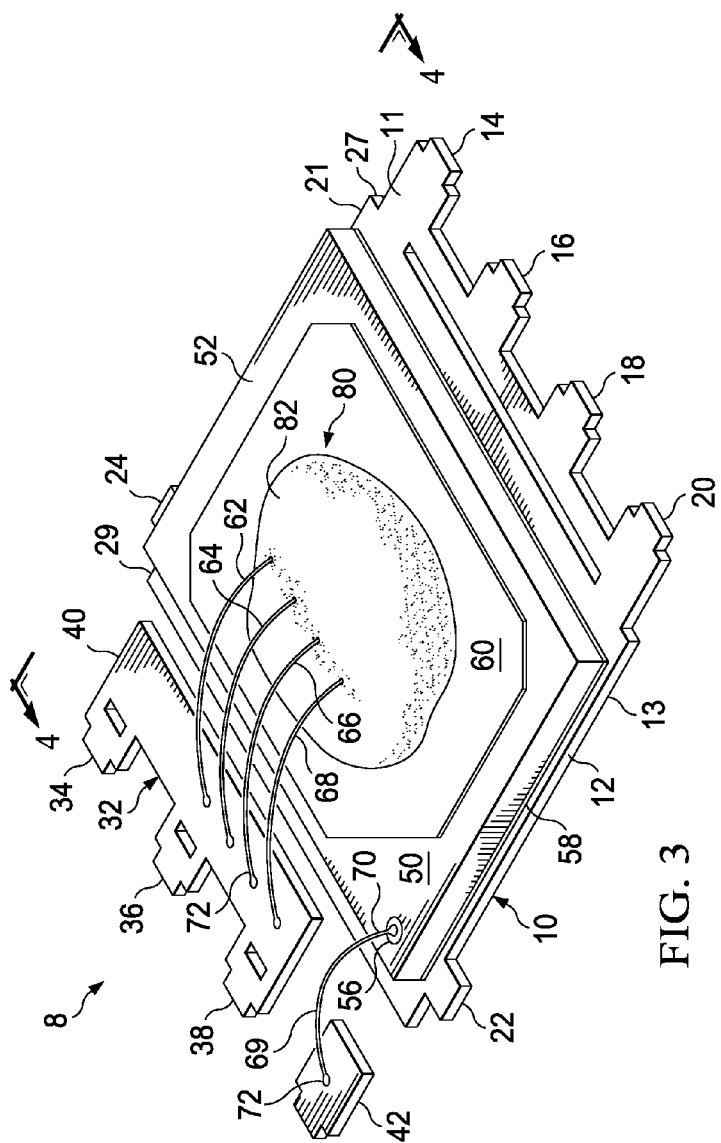
FIG. 3 is a top isometric view of another integrated circuit assembly in a later stage of the PQFN package formation process than FIG. 1.

This specification, in general, discloses an integrated circuit ("IC") assembly 8, FIG. 3, that includes an IC die 50 with a metallization layer 60 on a first (top) face thereof. A plurality of lead wires 62, 64, 66, 68 are bonded at first end portions 70 thereof, FIG. 1, to the top metallization layer 60. A conductive layer 80, FIG. 3, attached to the top metallization layer 60 covers the first ends 70 of the lead wires 62, etc. Having thus generally described an IC assembly 8, various embodiments thereof and of a molded power quad flat no-lead ("PQFN") package 100, FIGS. 5 and 6, that may be formed therefrom, as well as methods of making such an IC assembly and package will now be described in detail.

As used herein directional terms such as up, down, top, bottom, vertical, horizontal and the like are used in a relative sense, usually in reference to components of the drawing figures, to describe the relationship between various parts or layers of an integrated circuit package or other object that is being described. The use of such terms does not imply any particular orientation in a gravitational field unless the context clearly indicates otherwise. Thus, using the term "top" in this sense, if the roof portion were referenced as "the top of a car" then "top of the car would continue to mean the roof portion of the car regardless of whether the car were upright or inverted in a ditch.

Figure 4:
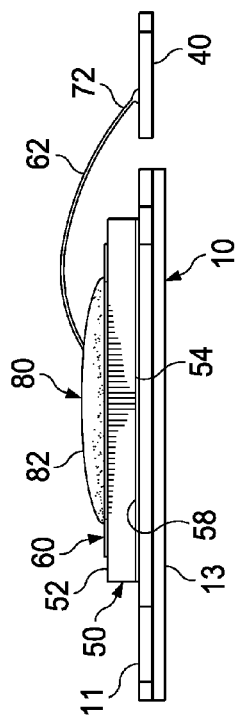
FIG. 4 is a side elevation view of the integrated circuit assembly of FIG. 3.
Figure 5:
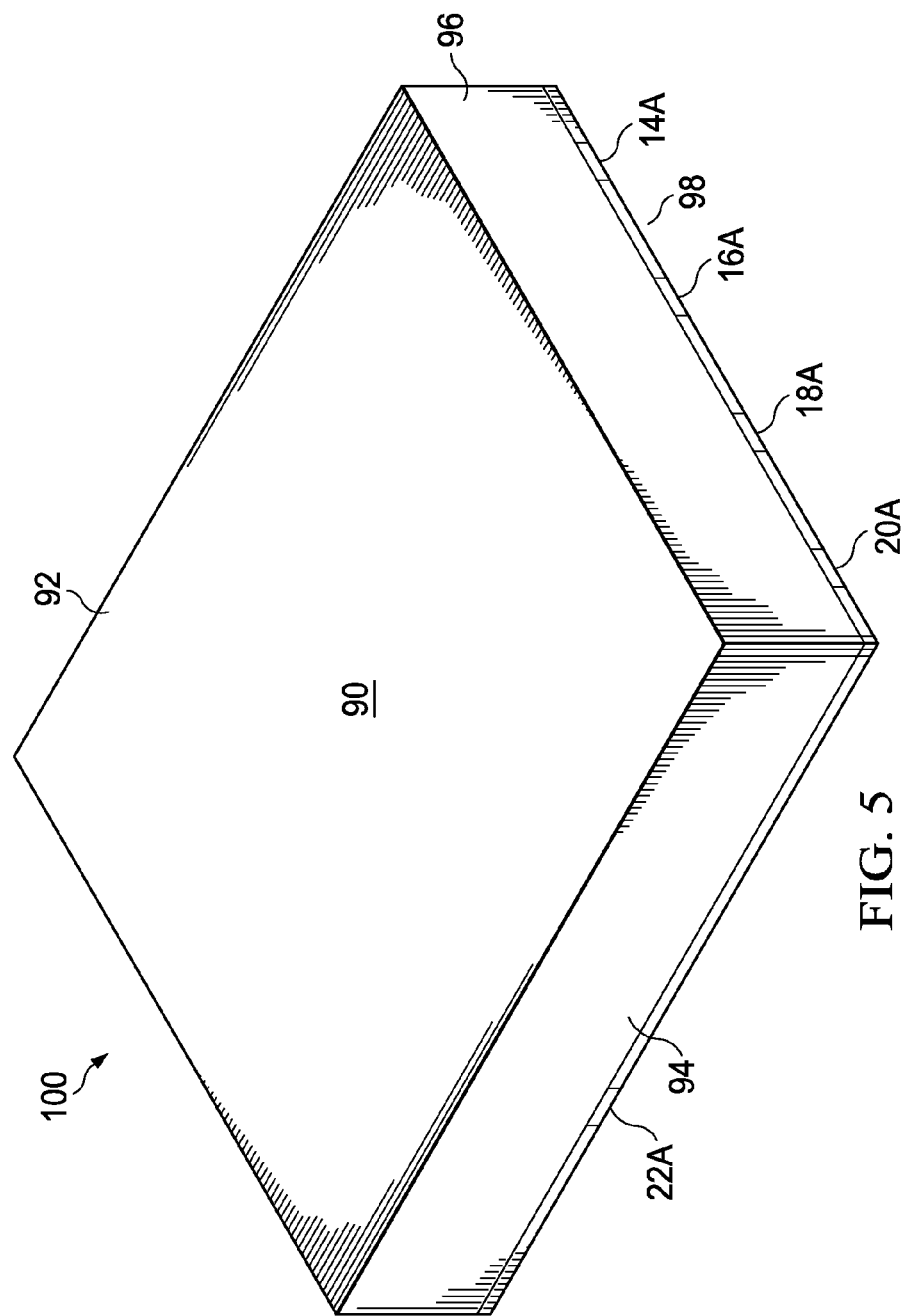
FIG. 5 is a top isometric view of a molded PQFN package formed from the integrated circuit assemblies of FIGS. 1-4.

FIG. 1 is a top isometric view of an integrated circuit ("IC") assembly 6 that is a subassembly of a PQFN package 100 such as illustrated in FIG. 5. The IC assembly 6 of FIG. 1 includes a leadframe 10 having a top surface 11 and a bottom surface 13. The leadframe 10 has a die pad portion 12 and a plurality of longitudinally extending peripheral lead portions 14, 16, 18, 20 integrally connected to the die pad portion 12 by a web portion 21 at one longitudinal end 27 of the leadframe. Lead portions 22 and 24 extend laterally from the die pad portion 12. The leadframe 10 also includes a power bar portion 32 at a second longitudinal end 29 of the leadframe 10. The power bar portion 32 is adapted to be connected to a relatively high current power source. The power bar portion 32 has longitudinally extending lead portions 34, 36, 38 integrally attached to a connection bar 40. The connection bar 40 is shown in FIGS. 1-4 as being in disconnected and spaced apart relationship with the leadframe die pad portion 12. Similarly separate lead portion 40 is also shown disconnected from the die pad portion 12. However, it is to be understood that, although not shown in FIG. 1, the leadframe 10, at this stage of the formation process, is part of a leadframe strip having multiple integrally connected leadframes (not shown). The distal ends of the lead portions 34, 36, 38, 42 are connected to other portions of this leadframe strip which holds these lead portions in the relationship shown in FIG. 1 until after molding and singulation as described below.

A die 50 having a top or first surface 52 and a bottom or second surface 54, FIG. 2, is mounted on the leadframe die pad portion 12 by conductive die bonding material 58. The conductive bonding material 58 may be solder paste, which is reflowed in a reflow oven, or may comprise a conductive adhesive such as silver epoxy, which may be cured in a curing oven, or may comprise other conductive bonding material. An electrode (not shown) on the bottom surface 54 of the die 50 is connected to internal circuitry (not shown) of the die 50. This bottom electrode is electrically connected to the die pad portion 12 by conductive bonding material 58, as best shown in FIGS. 1 and 2. The die pad portion 12, as previously indicated, is integrally formed with and electrically connected to the peripheral lead portions 14, 16, 18, 20, 22 and 24. Thus, the peripheral lead portions 14, 16, etc. are electrically connected to the internal circuitry of the die 50.

The die 50 has a top metallization layer 60, which may be aluminum or copper, or another metal. The thickness of the metallization layer 60 may be between about 1 μm and about 3 μm. The metallization layer 60 may be conventionally provided on the die 50 as by metal plating, vapor deposition, evaporation, electroless plating or other common metal deposition techniques. The internal circuitry of the die 50 may also be connected to the top metallization layer 60. A plurality of lead wires 62, 64, 66, 68 each have a first end 70 connected to the metallization layer 60 as by conventional ball bonds. These ball bonds may typically be spaced apart at a distance, for example, of between about 100 μm and about 200 μm, but they may also be spaced farther apart The second ends 72 of the lead wires 62, 64, etc., are attached at spaced apart positions to the power bar 32 as by conventional wedge bonds. Another lead wire 69 is connected at a first end 70 to a contact pad 56 on the top surface 52 of the die 50. This contact pad 56 is positioned outside the metallization layer 60. The second end 72 of lead wire 69 is attached to the isolated lead portion 42. Lead portion 42 is adapted to be connected to a control voltage. The power bar 32 is connected to an external power source from which the die receives its operating energy. Substantial current may pass through the small diameter lead wires 62, 64, 66, 68 that are connected to the power bar 32. As a result, spreading resistance in the metallization layer 60 in the region of the leads 62, 64, 66, 68 may be problematic, particularly when the leads are transmitting relatively high currents.

Applicants have discovered that the problem of electrical spreading resistance in the top metallization layer 60 may be substantially overcome with the assembly illustrated in FIG. 3. In FIG. 3, a layer of compliant, i.e., physically moldable, conductive material, which may be a silver ("Ag") epoxy paste layer 80, has been applied to the metallization layer 60 in the region where the lead wires 62, 64, 66, 68 are connected. The Ag epoxy may be applied as a paste and cured by heating at a predetermined temperature for a predetermined period. The Ag epoxy layer 80 in one embodiment extends at least about 200 μm laterally outwardly from each of the lead wires 62, 64, 66, 68 and extends to a height, e.g., 100 μm, sufficient to cover the connecting ball bond and a short length, of each lead wire 62, 64, 66, 68. The composition of the Ag epoxy layer may be e.g., about 75% Ag. Other conductive pastes, epoxies, or adhesives may be used in place of the Ag epoxy paste, for example, Ormet® 260C. As best illustrated in FIG. 4, the Ag epoxy layer 80 may have a generally dome-shaped top surface 81.

Figure 6:
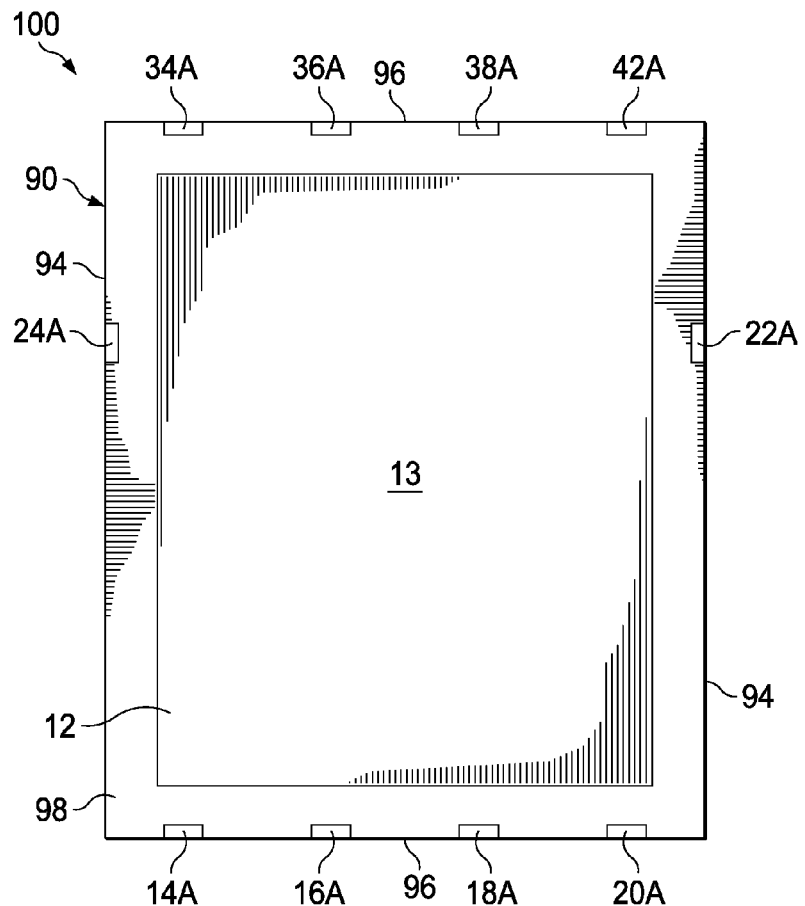
FIG. 6 is a bottom isometric view of the molded PQFN package of FIG. 5.

As shown in FIGS. 5 and 6, the IC assembly 8 illustrated in FIGS. 3 and 4 may be encapsulated in a mold layer 90 and has a flat top surface 92, flat lateral side surfaces 94, flat longitudinal side surfaces 96 and a flat bottom surface 98 formed primarily by the mold layer 90. The various lead portions 14, 16, 18, 20, 22, 24 34, 36, 38 and 42, FIG. 3, may have terminal ends that terminate flush with the mold layer 90. Such terminal ends of the lead portions are illustrated at 14A, 16A, 18A, 20A, 22A, etc., in FIGS. 5 and 6. As further illustrated in FIG. 6, the bottom surface 13 of the leadframe die pad portion 12 is exposed and flush with the surrounding mold compound on the bottom surface 98 of the PQFN 100. Thus, the mold layer 90 covers the entire die 50 and lead wires 62, 64, etc. and exposes only the ends of the lead 14A, 16A, etc., and die pad portion 12 bottom surface 13.

In one embodiment of the molded PQFN package 100 of FIGS. 5 and 6, the lead wires 62, 64, etc., FIG. 3, may be made from gold, aluminum or copper, and may have a diameter of about 9 mils to 20 mils. The leadframe 10 may be constructed from copper or a copper alloy and may have a thickness of about 6 mils to 10 mils or thicker. The mold layer 90 may be conventional transfer mold compound which is typically primarily epoxy. The die 50 may have lateral and longitudinal dimensions in a range of about 1 mm to about 4 mm and may have a thickness range of about 2 mils to about 12 mils. It is to be understood that the above dimensions and materials are given only by way of example and not limitation. Component parts with various other dimensions and constructed from other materials could also be used as will be appreciated by those skilled in the art.

Methods by which the molded PQFN package 100 and subassemblies thereof may be made will now be described Initially, a leadframe strip (not shown) is conventionally etched or stamped to form a desired leadframe pattern/shape. A typical leadframe strip may be about 70 mm wide by about 300 mm long. The die pad portions 12 on each leadframe 10 in the leadframe strip may then have solder paste 58, conductive epoxy or other conductive bonding material applied thereto, as by conventional screen printing. The dies 50 are then mounted on the bonding material 58 applied to each die pad portion 12, as by use of a conventional pick and place machine. The leadframe strips and dies 50 mounted thereon are next moved to a reflow oven where the bonding material is reflowed or cured to bond the dies 50 to the leadframe die pad portions 12. Next, the assemblies may be conventionally flux cleaned. After this the leadframe strips are moved to a wire bonding station where lead wires 62, 64, etc., are bonded to the dies 50 and associated leadframes 10. Wire bonding is well known to those skilled in the art. Next, the leadframe strips are moved to an epoxy dispense station where Ag epoxy or a similar material is applied to the top surface of the metallization layer 60 in the wire bond region. A conventional epoxy dispenser and conventional robotics may be used for this purpose. Next, the leadframe strips are moved to a cure oven, which for Ag epoxy may be operated at a temperature of about 150° C. to 175° C. for a period of about 45 minutes to 60 minutes. Next, the leadframe strips are moved to a conventional mold station such as, for example, a conventional transfer mold station where mold compound 90 is applied to each leadframe strip. The molded leadframe strips emerging from the transfer mold are then deflashed and moved to a plating station where the exposed bottom surface 13 of the leadframe die pad portions 12 and the ends of the lead portions, e.g., 14A, 16A, etc., are plated with tin or another appropriate metal to prevent oxidation. The molded leadframe strips may then be moved to an annealing oven where the metal plating may be annealed at an appropriate temperature, e.g., about 150° C. to about 175° C., for a predetermined period, e.g., about 60 minutes. Next, the molded leadframe strip may be moved to a singulating station where singulating saws cut the molded leadframe strip along saw streets that produce the multiple molded PQFN packages 100, as shown in FIGS. 5 and 6. Each of the various steps described above, except for the dispensing of Ag epoxy on top metallization layer 60 and lead wire ends 70 and the curing of metallization layer 60 may be conventional process steps for forming a molded PQFN package.

Although a method for making a molded PQFN has been described in detail above, it will be understood that the technique described for solving the problem of electrical spreading resistance in a thin metallic conduction layer 60 of the PQFN die 50 is also applicable to other electronic devices and other IC packaging applications. For example, the same technique of dispensing a Ag epoxy or other appropriate conductive layer on top of a thin metallic layer to which lead wires are bonded is also applicable to any of the following components and assemblies: SOIC, TSOP, TSSOP, DPAK, TO220, or applicable multichip modules, as well as any other components or assemblies where electrical spreading resistance may be an issue.

Figure 7:
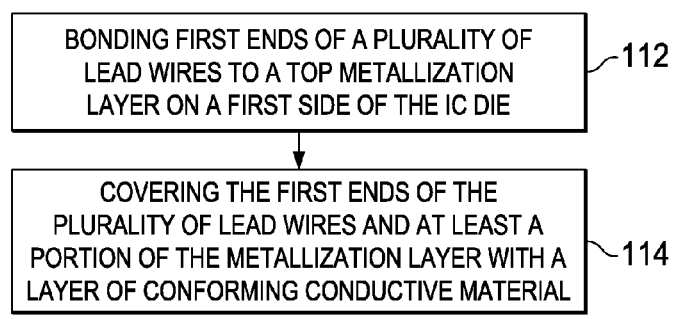
FIG. 7 is a flow chart of a method of attaching an integrated circuit die ("IC") to external circuitry.

It will be appreciated from the above that one method of connecting a die to external electronic circuitry may include, as illustrated in FIG. 7, step 112, bonding first ends of a plurality of lead wires to a top metallization layer on a first side of a die, 112. The method may further include covering the first ends of the plurality of lead wires and at least a portion of the metallization layer with a layer of compliant conductive material, as shown at 114.

While certain structures and methods for obviating spreading resistance problems in thin metallization layers of dies has been described herein, various alternative structures and methods will become apparent to those skilled in the art after reading this disclosure. It is intended that the claims be broadly construed to cover all such alternative structures and methods, except to the extent limited by the prior art.

What is claimed is:
1. An integrated circuit ("IC") assembly, comprising:
an IC die having a metallization layer positioned on a surface of the IC die;
lead wires, each having a first end and a second end, the first ends of the lead wires bonded to the metallization layer; and
a contiguous conductive layer applied to the metallization layer, the contiguous conductive layer covering the first ends of the lead wires.
2. The IC assembly of claim 1, wherein the metallization layer has a thickness ranges from 1um to 3um.
3. The IC assembly of claim 1, wherein the contiguous conductive layer includes a layer of compliant material.
4. The IC assembly of claim 1, wherein the contiguous conductive layer includes a silver epoxy paste layer.
5. The IC assembly of claim 1, wherein:
the IC die includes a top surface and a bottom surface opposing the top surface; and
the metallization layer is deposited on the top surface of the IC die.
6. The IC assembly of claim 1, further comprising:
a leadframe having a die pad portion and a lead portion, wherein:
the second ends of lead wires are bonded to the lead portion; and
the IC die includes a top surface and a bottom surface opposing the top surface, the bottom surface of the IC die is mounted on the die portion.
7. The IC assembly of claim 6, further comprising:
a mold layer covering the IC die, the lead wires, and a portion of the leadframe.
8. The IC assembly of claim 6, wherein the leadframe includes a power bar portion on which the lead portion is mounted such that the second ends of the lead wires are electrically coupled to the power bar portion.
9. The IC assembly of claim 1, wherein the first ends of the lead wires are ball bonded to the metallization layer.
10. The IC assembly of claim 1, wherein the first ends of the lead wires are wedge bonded to the metallization layer.
11. An integrated circuit ("IC") package, comprising:
a leadframe including a die pad portion and a lead portion;
an integrated circuit ("IC") die having a top surface facing away from the leadframe and a bottom surface mounted on the die pad portion of the leadframe;
a metallization layer formed on the top surface of the IC die;
lead wires each including a first end and a second end, the first ends bonded to the metallization layer, and the second ends bonded to the lead portion of the leadframe; and
a conductive layer formed on the metallization layer to cover and join the first ends of the lead wires above the IC die.
12. The IC package of claim 11, further comprising:
a mold layer covering the IC die, the lead wires, and a portion of the leadframe, the mold layer having flat lateral side surfaces and terminals flushing with the lateral side surfaces and coupled with at least one of the lead wires.
13. The IC package of claim 11, wherein the metallization layer has a thickness ranges from 1um to 3um.
14. The IC package of claim 11, wherein the conductive layer includes a compliant material.
15. The IC package of claim 11, wherein the conductive layer includes a contiguous layer of silver epoxy paste.
16. The IC package of claim 11, wherein the first ends of the lead wires are ball bonded to the metallization layer.

17. The IC package of claim 11, wherein the first ends of the lead wires are wedge bonded to the metallization layer.

* * * * *